(12) United States Patent
Baba-Ali

(10) Patent No.: US 7,589,819 B2
(45) Date of Patent: Sep. 15, 2009

(54) METHOD FOR THE GENERATION OF VARIABLE PITCH NESTED LINES AND/OR CONTACT HOLES USING FIXED SIZE PIXELS FOR DIRECT-WRITE LITHOGRAPHIC SYSTEMS

(75) Inventor: Nabila Baba-Ali, Paris (FR)

(73) Assignee: ASML Holding N.V., Veldhoven (NL)

( * ) Notice: Subject to any disclaimer, the term of this patent is extended or adjusted under 35 U.S.C. 154(b) by 409 days.

(21) Appl. No.: 11/453,039

(22) Filed: Jun. 15, 2006

(65) Prior Publication Data

US 2006/0236295 A1 Oct. 19, 2006

Related U.S. Application Data

(62) Division of application No. 10/439,326, filed on May 16, 2003, now Pat. No. 7,063,920.

(51) Int. Cl.
*G03B 27/42* (2006.01)
*G03B 27/32* (2006.01)
(52) U.S. Cl. .............. 355/53; 355/77; 716/19; 716/20; 716/21; 430/30
(58) Field of Classification Search ............. 355/53, 355/67, 71, 77; 430/22, 30; 716/19–21
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,691,541 A | 11/1997 | Ceglio et al. | |
| 5,808,797 A | 9/1998 | Bloom et al. | |
| 5,900,637 A | 5/1999 | Smith | |
| 5,982,553 A | 11/1999 | Bloom et al. | |
| 6,038,020 A | 3/2000 | Tsukuda | 356/237.5 |
| 6,133,986 A | 10/2000 | Johnson | |

(Continued)

FOREIGN PATENT DOCUMENTS

EP 1 454 194 A0 9/2004

(Continued)

OTHER PUBLICATIONS

Official Communication relating to European Patent Application No. 04011288.0—1226 dated Dec. 27, 2007, 4 pgs.

(Continued)

*Primary Examiner*—Alan A Mathews
(74) *Attorney, Agent, or Firm*—Sterne, Kessler, Goldstein & Fox P.L.L.C

(57) ABSTRACT

Provided is a method and system for developing a lithographic mask layout. The lithographic mask layout is adapted for configuring an array of micro-mirrors in a maskless lithography system. The method includes generating an ideal mask layout representative of image characteristics associated with a desired image. Next, an equivalent mask is produced in accordance with an average intensity of the ideal mask layout.

13 Claims, 10 Drawing Sheets

U.S. PATENT DOCUMENTS

| | | |
|---|---|---|
| 6,177,980 B1 | 1/2001 | Johnson |
| 6,285,488 B1 | 9/2001 | Sandstrom |
| 6,373,619 B1 | 4/2002 | Sandstrom |
| 6,544,698 B1 | 4/2003 | Fries .................. 355/53 |
| 6,687,041 B1 | 2/2004 | Sandstrom |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 7,063,920 B2 | 6/2006 | Baba-Ali |
| 2002/0021426 A1 | 2/2002 | Mei et al. |
| 2004/0041104 A1 | 3/2004 | Liebregts et al. |
| 2004/0130561 A1 | 7/2004 | Jain |
| 2005/0007572 A1 | 1/2005 | George et al. |

FOREIGN PATENT DOCUMENTS

| | | |
|---|---|---|
| EP | 1 454 194 A1 | 9/2004 |
| JP | 2002-506235 A | 2/2002 |
| WO | WO 98/33096 A1 | 7/1998 |
| WO | WO 98/38597 A2 | 9/1998 |
| WO | WO 98/38597 A3 | 9/1998 |
| WO | WO 99/45440 A1 | 9/1999 |
| WO | WO 00/42618 A1 | 7/2000 |
| WO | WO 03/052516 A1 | 6/2003 |

OTHER PUBLICATIONS

Translation of Office Action for Japanese Patent Application No. 2004-146979 drafted May 25, 2007, 3 pgs.

Search Report, dated Jan. 30, 2006, for European Patent Application No. EP 04 01 1288, 2 pgs.

Search Report, from Singapore Patent Appl. No. SG 200402578-9, 3 pages, mailed Dec. 17, 2004.

Sandstrom, Tor et al., Resolution Extensions in the Sigma 7000 Imaging Pattern Generator, Micronic Laser Systems AB, Strategic Development, Molndalsvagen 91, SE-435 Goteborg, Sweden, 11 pages.

Office Action, dated May 25, 2007, for JP Patent Application No. 2004-146979, 6 pgs.

Translated Office Action, dated Jul. 30, 2007, for Taiwan Patent Application No. 93113474, 6 pgs.

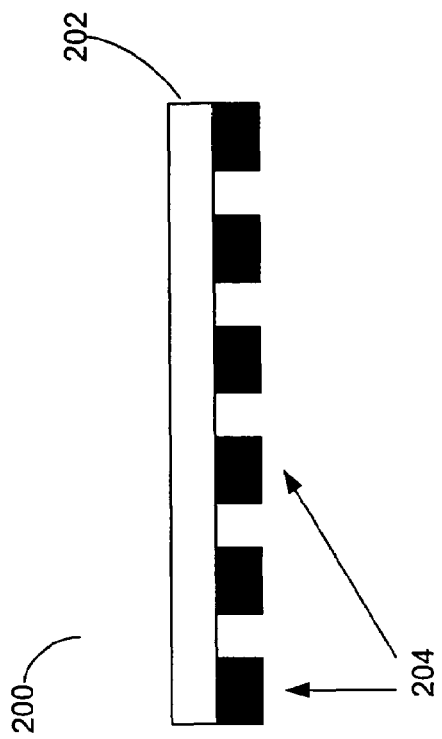
FIG. 2
(conventional)

Pixel/Pitch Determination

| n | | | | | R=image pitch/pixel width | | |
|---|---|---|---|---|---|---|---|
| | 1 | 2 | 3 | 4 | | | |
| image pitch (nm) | | n*R | | | Pattern pitch (nm) | pattern pitch/image pitch | Pixels in pattern pitch |
| 120 | 3 | | | | 120 | 1 | 3 |
| 130 | 3.25 | 6.5 | 9.75 | 13 | 520 | 4 | 13 |
| 140 | 3.5 | 7 | | | 280 | 2 | 7 |
| 150 | 3.75 | 7.5 | 11.25 | 15 | 600 | 4 | 15 |
| 160 | 4 | | | | 160 | 1 | 4 |
| 170 | 4.25 | 8.5 | 12.75 | 17 | 680 | 4 | 17 |
| 180 | 4.5 | 9 | | | 360 | 2 | 9 |
| 190 | 4.75 | 9.5 | 14.25 | 19 | 760 | 4 | 19 |
| 200 | 5 | | | | 200 | 1 | 5 |
| 210 | 5.25 | 10.5 | 15.75 | 21 | 840 | 4 | 21 |
| 220 | 5.5 | 11 | | | 440 | 2 | 11 |
| 230 | 5.75 | 11.5 | 17.25 | 23 | 920 | 4 | 23 |
| 240 | 6 | | | | 240 | 1 | 6 |
| 250 | 6.25 | 12.5 | 18.75 | 25 | 1000 | 4 | 25 |
| 260 | 6.5 | 13 | | | 520 | 2 | 13 |
| 270 | 6.75 | 13.5 | 20.25 | 27 | 1080 | 4 | 27 |
| 280 | 7 | | | | 280 | 1 | 7 |
| 290 | 7.25 | 14.5 | 21.75 | 29 | 1160 | 4 | 29 |
| 300 | 7.5 | 15 | | | 600 | 2 | 15 |

FIG. 4

| 1/2 pitch (nm) | average NILS (Equivalent layout) | average NILS (ideal, binary) | NILS degradation (%) |
|---|---|---|---|
| 70 | 0.93 | 1.42 | 34.5 |
| 80 | 1.7 | 1.7 | 0.0 |
| 90 | 1.45 | 1.79 | 19.0 |
| 100 | 1.73 | 1.94 | 10.8 |

FIG. 5

METHOD FOR THE GENERATION OF VARIABLE PITCH NESTED LINES AND/OR CONTACT HOLES USING FIXED SIZE PIXELS FOR DIRECT-WRITE LITHOGRAPHIC SYSTEMS

CROSS-REFERENCE TO RELATED APPLICATIONS

This application is a divisional of U.S. application Ser. No. 10/439,326, filed May 16, 2003, now U.S. Pat. No. 7,063,920, issued Jun. 20, 2006.

BACKGROUND OF THE INVENTION

1. Field of the Invention

The present invention is directed to pattern generation in photolithography systems.

2. Related Art

In maskless lithography systems, image patterns are generated by a micro-array of mirrors at an object plane of a target wafer. These mirrors can be tilted in a controlled manner to produce grey-scaling. On the wafer scale, these mirrors (pixels) can be demagnified to as little as a few tens of nanometers. In spite of this, because of the increasingly small and diverse patterns that are being targeted in deep ultraviolet (DUV) lithography, the critical dimension (CD) or pitch of these patterns is not necessarily a multiple of the pixel size.

CD and pitch are not necessarily big limitations for isolated patterns. However, finding an adequate pixel layout over a continuous range of pitches for grouped patterns can be complicated and requires a systematic approach for not only generating images with the appropriate pitch and periodicity, but also for generating images that will meet standard image quality requirements.

Traditional photolithographic images are produced using a glass or fused silica mask that is encoded with a particular image. An underside of the mask is then coded with chrome or other similar material. Focused light is then passed through the mask to project an image onto a recessed substrate where the image can be captured. Light passes through the transmissive portion of the mask to form light portions of the image while the chrome material on the underside of the mask acts to absorb light to form dark portions of the image. Each mask is configured to produce only a single image.

Maskless lithography provides many benefits over lithography using conventional reticles. One of the greatest benefits of a maskless lithographic system is the ability to use a single programmable mask to produce multiple lithographic images. As known in the art, maskless reticles include an array of thousands of micro-mirrors. The array of mirrors serves as a programmable array of light modulators, where a deflected mirror corresponds to a dark portion of a desired pattern and an undeflected mirror corresponds to a bright portion of a pattern with gray levels for intermediate states. An illumination source is projected toward the micro-mirror device to produce an image on a substrate. A spatial light modulator (SLM) and a digital micro-mirror device (DMD) are examples of maskless reticle systems currently used in photolithography.

Although mask based reticles can only be used to produce a single image, the image produced by the mask based reticles is typically of a higher quality than images produced by SLM's. One of the issues contributing to some degradation in images produced by maskless reticles is that these images face some limitations due to size and other restrictions associated with the dimensions and characteristics of the mirrors. For example, in a maskless lithography system the mirrors can be tilted in a controlled manner to produce a grey-scaling. On the wafer scale, these mirrors or pixels can be demagnified to as little as a few tens of nanometers. However, due to the size and other limitations of the pixels and because of the increasingly small and diverse patterns that are being targeted in deep ultraviolet (DUV) lithography, the CD or pitch of these patterns might not be a multiple of the pixel size, as noted above.

What is needed therefore is a method and system to accommodate the creation of a wider variety of patterns for maskless lithography systems. More specifically, what is needed is a technique for maskless lithography using mirror arrays of a fixed size to print nested lines and contact hole at a variety of pitches.

BRIEF SUMMARY OF THE INVENTION

Consistent with the principles in the present invention as embodied and broadly described herein, an embodiment of the present invention includes a method for developing a lithographic mask layout, the lithographic mask layout is adapted for configuring an array of micro-mirrors in a maskless lithography system. The method includes generating an ideal mask layout representative of image characteristics associated with a desired image and producing an equivalent mirror based mask layout in accordance with an average intensity of the ideal mask layout.

The present invention provides a systematic approach to generating mask layouts using an array of fixed shape mirrors of fixed size to print grouped lines and contacts over a continuous range of pitches. This is particularly useful in the field of Maskless Lithography where the goal is to ensure that patterns can be printed over a wide range of pitches independently of the pitch of the mirror array.

Further features and advantages of the present invention, as well as the structure and operation of various embodiments of the present invention, are described in detail below with reference to the accompanying drawings.

BRIEF DESCRIPTION OF THE DRAWINGS/FIGURES

The accompanying drawings, which are incorporated in and constitute part of the specification, illustrate embodiments of the invention and, together with the general description given above and detailed description of the embodiments given below, serve to explain the principles of the invention. In the drawings:

FIG. 2 is an illustration of a conventional photo-lithographic mask;

FIG. 4 is a table illustrating a determination of the number of independent pixels required in an equivalent mask layout shown in FIG. 3.

FIG. 5 is a table illustrating a comparison of image characteristics associated with the equivalent mask layout shown in FIG. 3.

DETAILED DESCRIPTION OF THE INVENTION

Figure 1:
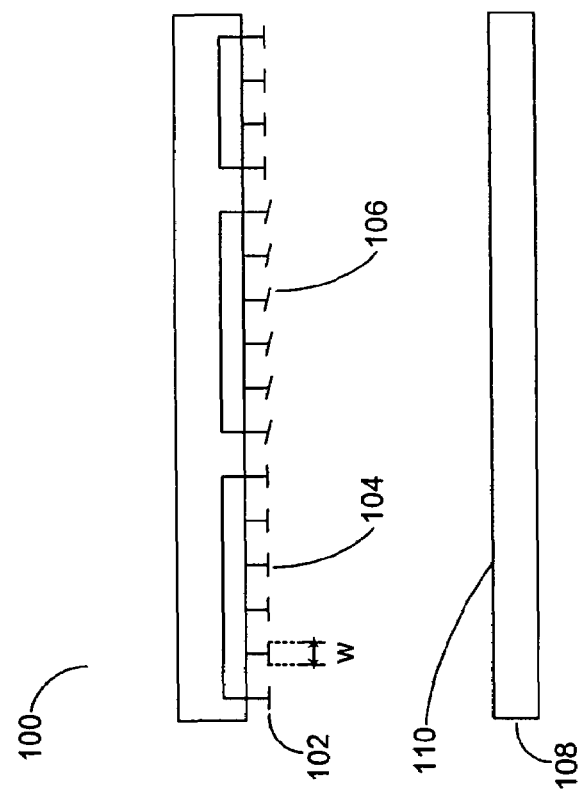
FIG. 1 is an illustration of a maskless lithography configured in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one of skill in the art that the present invention, as described below, may be implemented in many different embodiments of hardware, software, firmware, and/or the entities illustrated in the drawings. Any actual software code with the specialized controlled hardware to implement the present invention is not limiting of the present invention. Thus, the operation and behavior of the present invention will be described with the understanding that modifications and variations of the embodiments are possible, given the level of detail presented herein.

FIG. 1 is an illustration of a maskless reticle 100. The maskless reticle 100 can be e.g., a DMD or an SLM type device. The reticle 100 includes an array of mirror elements 102 including mirror elements 104 configured, e.g., in an on position to reflect incident illumination onto a wafer substrate 108 having a surface 110. Mirrors 106 are configured in an off position to dump the incident illumination. Each of the individual mirrors within the array 102 is of a predetermined width (W).

FIG. 2, on the other hand, is an illustration of a conventional mask 200 including a glass layer 202 with chrome segments 204 positioned on a surface of the glass layer 202. The mask 200 is also known in the art as a binary mask because it's either completely on or completely off, i.e., completely transmissive or completely opaque. Since the glass layer 202 is not pixelized, the quality of its resulting images is not restricted by pixel size to the same extent, as would be the case with an SLM-based reticle. The quality of images produced by the maskless system 100 is, however, dependent upon pixel size, especially since the pitch of associated image patterns is desirably an integer multiple of the pixel width. Therefore, one challenge is to be able to produce images using a maskless reticle, such as the system 100, having a quality comparable to images produced by a mask, such as a mask 200.

One approach to configuring maskless reticles to produce images having the quality, and other characteristics, comparable to images produced by a mask based system is to use the mask layout (image template) associated with the binary (ideal) mask 200 as a cornerstone. This cornerstone can then be used to develop an equivalent mask layout for the mirrors 102 within the mirror array 100. The equivalent mask layout is then used as an instruction template for configuring the mirror-array 102 to produce images having a quality comparable to images produced by the mask 200.

The first step to developing the equivalent mask layout based upon an ideal binary mask layout is to determine precisely what light is needed on the wafer surface 110 to produce a desirable lithographic image under ideal conditions. The efficiencies of this process are demonstrated by way of the following example.

Semiconductor device manufacturers typically produce wafers in accordance with very specific customer/user requirements. These requirements are in the form of image patterns and pattern parameters specified in terms of CD. For example one requirement may specify that a critical pattern be no wider than 70 nanometers at a given pitch. Thus, the customer might supply the pattern requirements in the form of a mask layout specifying, e.g., a requirement for 70 nanometer (nm) lines and spaces (L/S). In further support of the present example, assume the width (W) of the mirrors (pixels), within the mirror array 102, is 40 nanometers (40 nm$^2$ total size). Here, therefore, the goal will be to produce 70 nm L/S, thus, forming a pattern with a repeat period or pattern pitch of 140 nanometers. In practice, the present invention can be used to produce patterns at a variety of pitches with pixels at a variety of sizes.

Figure 3:
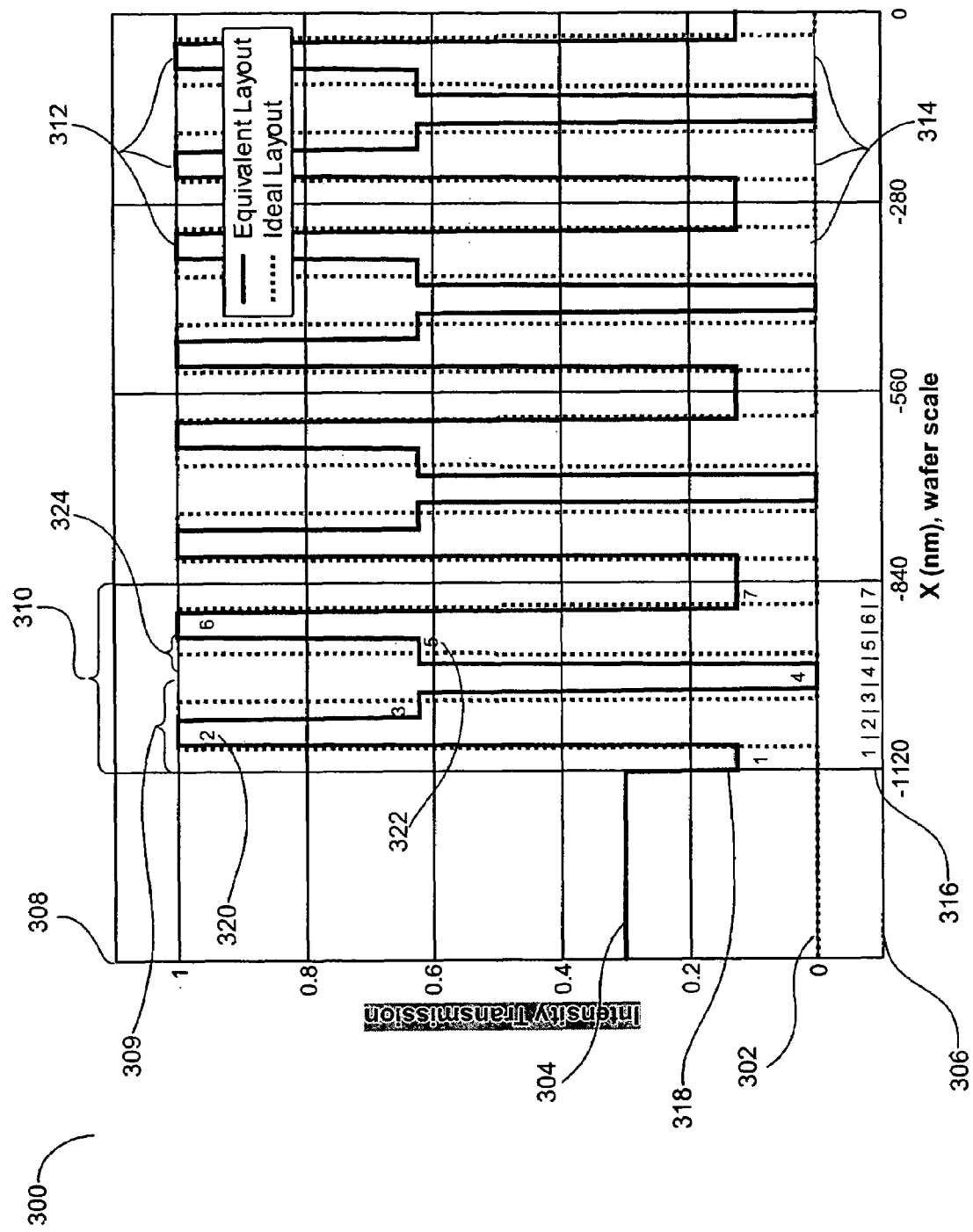
FIG. 3 is a graphical illustration of a mask layout developed in accordance with an embodiment of the present invention.

As an initial approach, one approach to producing 70 nm L/S from 40 nm pixels would be to put two dark 40 nm pixels side by side. That would produce an 80 nm line, but not quite a 70 nm line. In the alternative, one of the 40 nm pixels could be configured to be very dark and another gray, in order to achieve an aerial image that would result in having 70 nm L/S in the resist. Thus, it can be seen that if one can precisely determine exactly where the light should be projected onto the surface 110, without regard to pixel size, to configure the pixels within the array 102, then an image having sufficient quality and periodicity can be produced. FIG. 3 is an illustration of an early stage of this image production process.

FIG. 3 is a graphical representation 300 of an ideal binary mask layout 302 and a fully developed equivalent mirror-based mask layout 304. As known in the art, a mask layout is a graphical representation of the image production properties of a mask and can be used to program the tilt angle of the mirrors within an SLM array to produce a desired image. In the example of FIG. 3, as noted above, the goal is to produce 70 nm L/S using 40×40 nm$^2$ pixels.

From a different perspective, the ideal binary mask layout is a theoretical abstract template of where light would be projected on a wafer to produce an image if that light was produced using a conventional chrome and glass binary mask. Thus, the ideal binary mask layout is a layout produced independent of any pixel constraints. And, the ideal binary mask can be created using known techniques. Particularly, in the present invention, the ideal binary mask layout 302 is a conceptual illustration of how light would be projected on the wafer scale of the wafer 108 to produce 70 nm L/S if the mask 200 was used to transmit the light instead of the mirror array 102.

Ideal binary masks in general, and the ideal binary mask 302 in particular, have the same period or pitch as the targeted image (or a multiple in systems where the image is demagnified). The ideal binary mask 302 has a transmission function comprised of binary values with a spatial frequency equal to that of the desired pattern (or a multiple) and in which the mask transmission can vary continuously as a function of space. The graph 300 includes a wafer scale (X axis) 306 and an intensity transmission (Y axis) 308.

In the example of FIG. 3, the binary mask layout 302 has an image pitch indicated by the space 309 and a pattern pitch indicated by the space 310. The image pitch 309 is the repeat period of the image and the pattern pitch 310 is the repeat period of the mirror-based pattern required to print the desired image, which, in the case of FIG. 3, is the binary mask layout 302. The ideal binary mask layout 302 includes 70 nm lines 312 and 70 nm spaces 314, which combine to form, as known in the art, 1:1 nested lines. The production of the binary mask layout 302 is the first in a series of steps required to properly program the programmable mirror array 102 to produce a desired image in accordance with an embodiment of the present invention.

From yet another perspective, the ideal binary mask layout 303 provides a starting point, a framework in terms of periodicity, for determining what sort of mirror layout is required to fulfill the customer supplied pattern parameter requirements. This starting point enables the mask to be designed to achieve the required image periodicity and pitch, given the constraints imposed by the mirror/pixel width (W) of the mirror array 102. In other words, it provides a theoretical footprint for mapping the surface 110 of the wafer 108.

In order to complete the process for determining the proper programming of the mirror array 102, the equivalent mask layout 304 must be produced based upon the binary mask layout 302. To produce the equivalent mask layout 304, in which the transmission is only allowed to vary from pixel to pixel, the ideal binary mask layout 302 is ultimately averaged over pixel-wide segments. To perform this averaging, each area, such as the area 310, is divided by an amount equal to the pixel width (W) of the pixels within the exemplary mirror array 102.

In the example of FIG. 3, the pixel width (W) is 40 nanometers and the space 310 is 280 nanometers. The division of the space 310 by the pixel width (W) produces mask layout pixels 316, shown in FIG. 3. The pixels 316 are numbered as areas 1-7, each corresponding to a portion of the equivalent mask layout 304. As can be seen, the portion of the equivalent mask layout within the space 310 has a total of seven segments, each corresponding to one of the pixels 316.

Next, an intensity transmission value must be determined for each of the pixels 316. The intensity transmission values are determined by averaging the intensity value of the ideal binary mask layout within each pixel space 316, numbered 1-7. That is, the average intensity value of the ideal mask layout 302 across each of the pixel spaces 1-7 is assigned as the corresponding pixel's intensity value. An assignment of the averaged intensity values within each of the areas 107 produces individual pixels such as the pixels 318, 320 and 322. In other words, in order to form an intensity transmission value for the pixel 322 e.g., the intensity value associated with the ideal binary mask layout 302 is averaged across the space 324.

Upon visual observation of the graph 300, it can be seen that the intensity transmission value of the ideal binary mask layout 302 is a logical "1" across about 62% of the space 324. It is a logical "0" across about 32% of the space. Thus, an averaged intensity transmission value of the ideal binary mask layout 302, across the space 324, roughly corresponds to an intensity value of about 0.62. The entire equivalent mask layout 304 is produced in this manner. This process results with the equivalent mask layout 304 having a transmission function that will generally display several gray levels, as shown in the graph 300 of FIG. 3. In addition, the spatial frequency of the resulting pattern will be a multiple of the targeted spatial frequency and will depend on a ratio of the target spatial frequency over the pixel width.

Through generation of the ideal binary mask 302 and creation of the equivalent pixelized mask layout 304, a mirror array, such as the mirror array 102, can be programmed to generate patterns and print nested lines and contact holes at a variety of pitches. An exemplary pixel/pitch determination matrix is provided in FIG. 4 to illustrate the functionality of this process across a variety of image pitches.

FIG. 4 includes an exemplary matrix 400 which functions as a tool to determine a number of independent pixels 402. The independent pixels 402 are required to be configured within the mirror array 102 in order to print patterns at a variety of images pitches 404 and pattern pitches 406. This is performed by calculating the ratio of the desired image pitch, over the pixel width ($R_1$). If $R_1$ is not an integer, then it is multiplied by increasingly large integer numbers (n=2, 3 etc) until the product $R_n = n \ast R_1$ becomes an integer number. The smallest $R_n$ that is an integer number represents the minimum number of independent pixels needed to build the pattern.

Within the matrix 400, the pattern pitch 406 is equal to (n) times the image pitch, where (n) is the smallest integer such that [(n)*pitch]/(Pixel width) is an integer number of nanometers. Once the number of independent pixels 402 has been determined using an exemplary technique, such as the matrix 400 of FIG. 4, an aerial image can be developed to test the quality of the image that would result from the equivalent mask layout 304. This image is developed using a lithographic image simulation. Once the equivalent mask layout 304 has been generated, a pixelized image representative of the equivalent mask layout 304 can be simulated in order to assess quality characteristics thereof.

With the use of standard turn-key lithographic simulation tools, such as Prolith™ simulation devices (not shown), a simulated aerial image can be constructed, based upon the equivalent mask layout 304. A variety of lithographic simulation tools are available for use as efficient and cost effective tools to easily assess the quality of pattern parameters and other features associated with lithographic images.

In the present invention, techniques known in the art can then be used to assess the performance metrics or characteristics associated with the simulated images. For example, in each line of a simulated image, such as the lines 312 of FIG. 3, metrics such as the width or CD at a target threshold, the normalized image log slope (NILS), and line position are determined. In particular, these performance metrics or characteristics are assessed for images associated with the equivalent mask layout 304. These metrics are compared with metrics of the ideal binary mask layout 302 or other state-of-the-art reticles such as Attenuating Phase-shifting Masks or Alternating Phase-shifting Masks. (The binary mask is used as a starting point for calculating the mirror layout. The image can then be checked against the image due to a binary mask or any other state-of-the-art reticle).

The calculated line position, for example, is compared to where the line should be located ideally (ideal, continuous mask layout) and the difference between the two, also referred to as placement error (PE), is calculated. In addition, by pooling the CD, NILS and PE data for all lines (not essential), averages and ranges can be extracted. The ranges will be a measure of how uniform the lines are and the averages will be an indication of whether the basic targets have been reached or not. For example, the average NILS needs to meet a certain target that will ensure sufficient exposure latitude, and the average CD through focus also needs to be tracked to make sure that the mask layout results in sufficient depth of focus. The results of these comparisons are then used to adjust features and parameters of the simulated aerial image in order to ultimately test image quality.

FIG. 5 is a tabular illustration 500 of a comparison between, for example, NILS values 502 of an ideal binary mask and NILS values 504 of an equivalent mirror-based mask layout. Values 506 illustrate a degree of degradation between the values 502 and the values 504. Column 508 indicates that these comparisons can be made across a variety of pitch values. In particular, the line entry 510 of the table 500 illustrates a comparison of NILS values between the ideal binary mask layout 302 and the equivalent mask layout 304, shown in FIG. 3.

The table 500 indicates that although the equivalent mask layout 304 can be used as a tool to configure mirrors within the mirror array 102, the aerial image produced by such an array is 34.5% degraded when compared to an aerial image derived from the ideal binary mask layout 302. Thus, although the mirror array 102 has been properly configured using the technique of the present invention to produce images having a variety of pitches and periods, the performance characteristics of these images, such as the NILS, can suffer significant degradation when compared to images produced by the ideal binary mask layout.

If the quality of the image (as defined in the previous paragraph, for example) is thought to be insufficient, the equivalent mirror-based mask layout 304 can be improved by optimizing the choice of gray levels (or tilt angles) used in the equivalent mirror-based mask layout 304.

Figure 6:
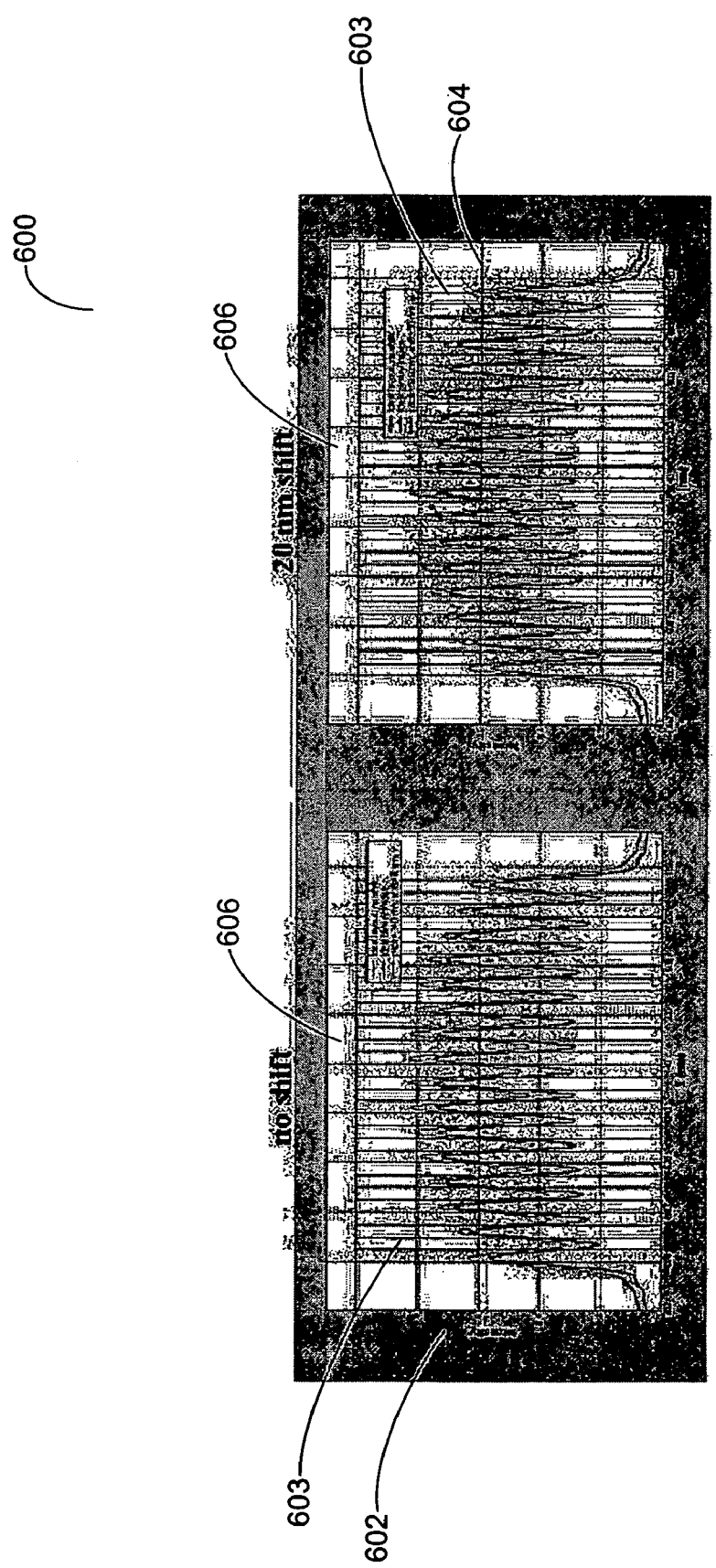
FIG. 6 is a graphical illustration of a shift function applied to a simulated photolithographic aerial image.

FIG. 6 is a graphical illustration 600 of a shifting technique used in the present invention, as an initial step in optimization. The technique illustrated in FIG. 6 involves using the simulation tools to shift the resulting aerial image in a plane of the wafer 108. The ability to shift the aerial image in the wafer plane is desirable because it provides a mechanism to position patterns anywhere on the wafer. It also facilitates the offsetting of image placement errors due to defects in the optics. Additionally, shifting the image enables the very precise alignment of images in one wafer plane, with images in another wafer plane, in cases where multiple wafer devices are being developed.

Therefore, in the case of the graph 600 shown in FIG. 6, an aerial image 603, developed based upon the equivalent mask layout 304. The aerial image 603 is shifted by half a pixel, for example, in the wafer plane with respect to a pixel grid 606, as depicted in a graph 602. The shifting produces a shifted aerial image, as shown in the graph 604. In the present invention, a noteworthy achievement is the ability to perform a shift of the aerial image 603, to produce the graph 604, without distorting the aerial image, as can be observed. After completion of the shift function, the simulation can be re-accomplished and the performance metrics (noted above) of the resulting aerial image can again be examined to determine if they now meet the image quality requirements. If the performance metrics continue to be insufficient, additional improvements can be achieved by optimizing the choice of gray levels (or tilt angles) used in the equivalent mirror-based mask layout 304, as shown in FIG. 7.

Figure 7:
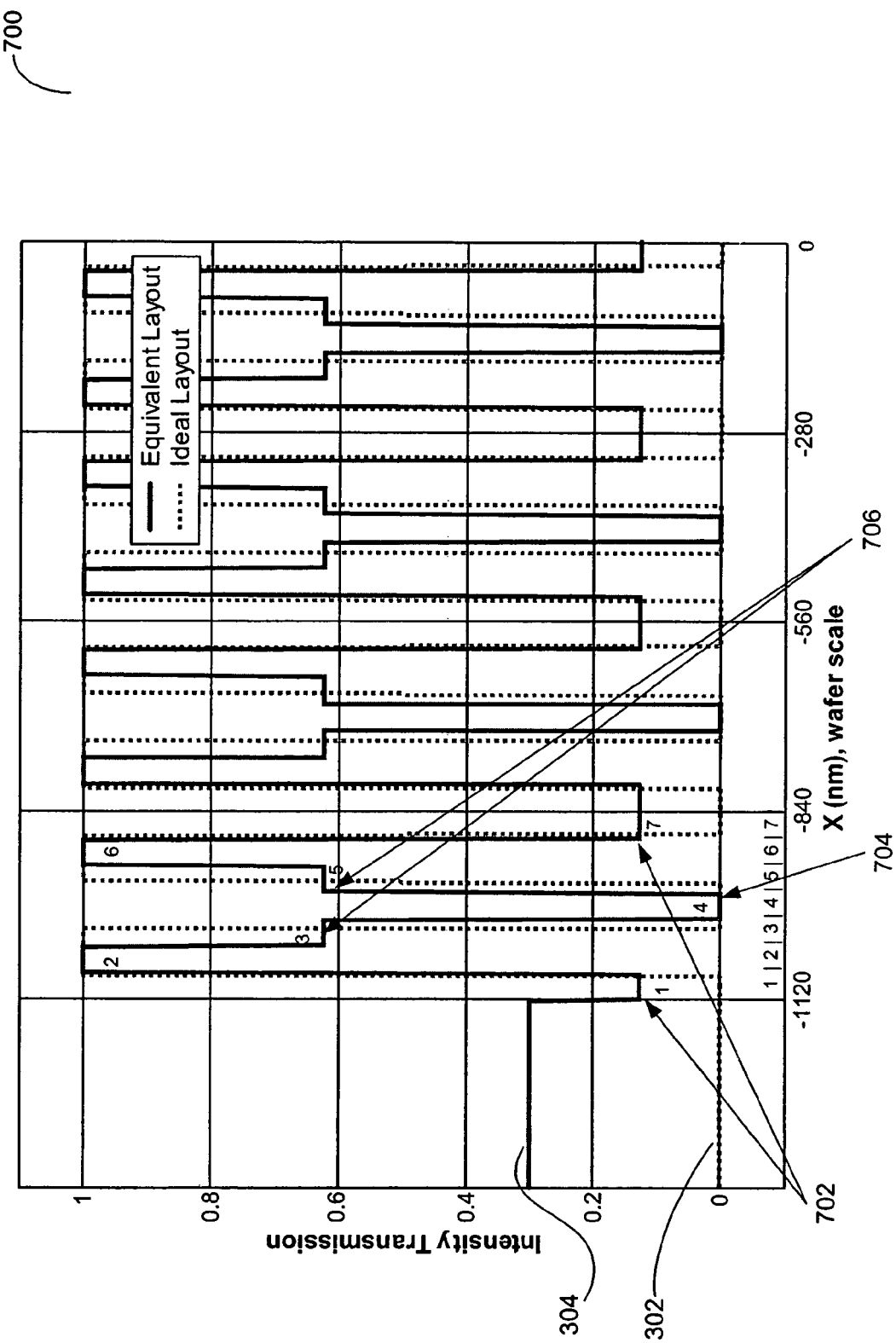
FIG. 7 is a graphical illustration of perturbation of individual pixel grey-scale levels.

FIG. 7 is a graphic illustration of perturbing the gray level of selected pixels within the equivalent mask layout 304 in order to further improve quality of the resulting aerial image. As discussed above and illustrated in FIG. 4, the number of independent pixels required to form the equivalent mask layout 304, as determined above, is again a consideration.

By way of example, FIG. 7 conveys a user's desire to perform an adjustment 702 on the pixels in areas 1 and 7 of the equivalent mask layout 304. This adjustment reduces the transmission intensity or increases the tilt angle in order to improve line contrast of the pixels in areas 1 and 7. Additionally, or in the alternative, the user might desire to perform an adjustment 704 on the pixel in area 4 by increasing the tilt angle in pixel 4. Finally, the user might perform an adjustment 706 on the pixels in spaces 3 and 5, again by reducing the transmission or increasing the tilt angle. In this manner, the user can use the simulation tool to perturb, or otherwise adjust, the independent pixels within a one pitch segment of the equivalent mask layout 304, in order to achieve improvements in the resulting aerial image.

Once all of the adjustments have been made within the selected one pitch segment of the equivalent mask 304, the adjustments can be applied to all of the other pixels associated with the equivalent mask layout 304. The effects of these perturbations on image quality can be carefully monitored using the lithography simulation tool. This is an iterative optimization process which may occur over a small range of gray levels (or tilt angles) to search for an improved solution. When the required image quality requirements have been achieved, the perturbations can be stopped.

Thus, the perturbation feature, discussed within the context of FIG. 7, provides the ability to adjust tilt angles and gray levels on selected pixels in order to select the appropriate combination of individual pixel adjustments. The user can then execute the lithography simulation to determine which particular combination of grey-tone and tilt angle adjustments might be most satisfactory and produce the most acceptable solution. This process provides an approach where an initial solution is developed as a starting point. That initial solution is perturbed within a certain range in a predefined manner, using predefined steps, thus resulting in the selection of the most appropriate combination of adjustments that produce the most optimal solution. Other optimization techniques can also be applied.

Figure 8:
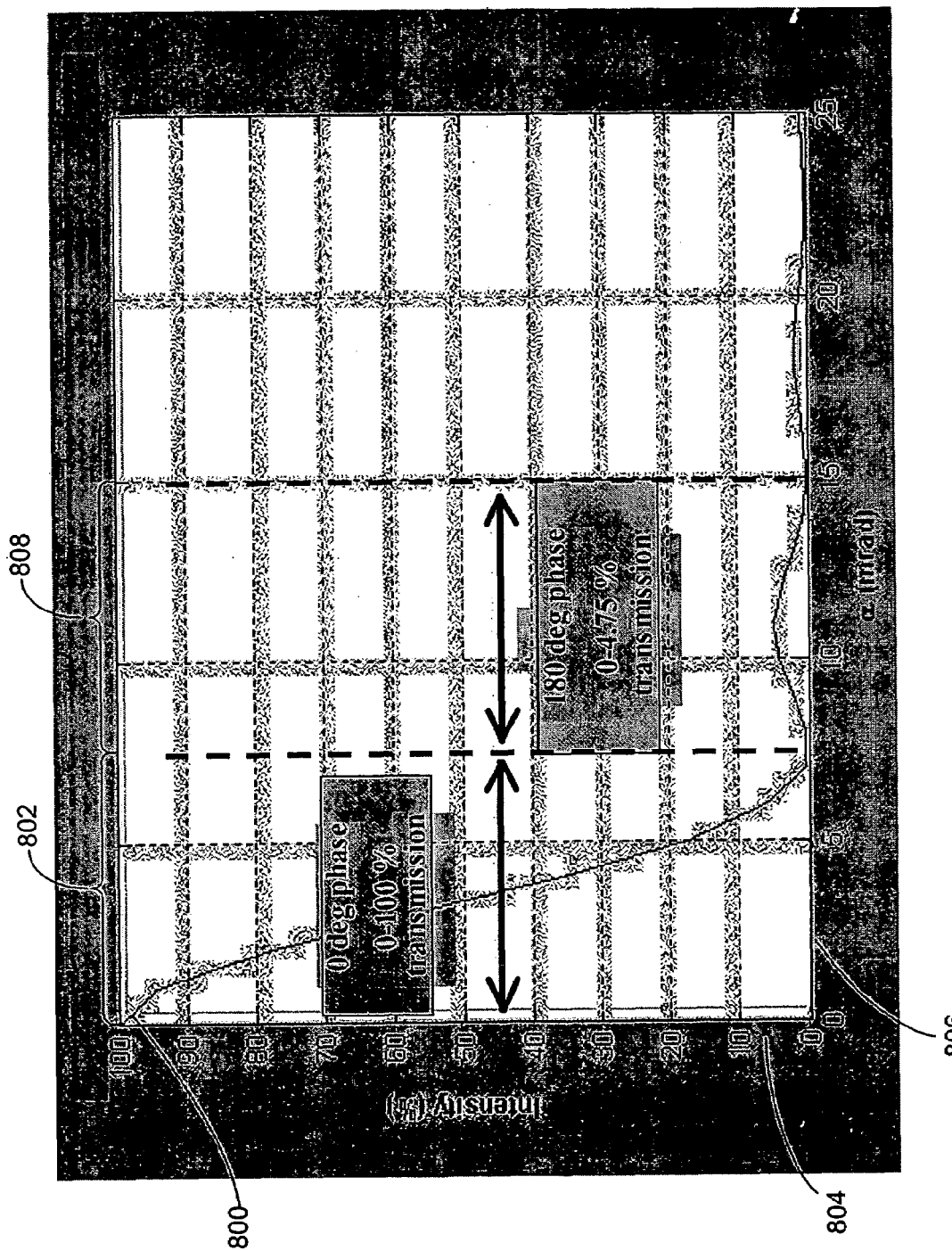
FIG. 8 is a graphical illustration of the collective mirror behavior illustrating the relationship between gray scale and mirror tilt angle in accordance with an embodiment of the present invention.

Finally, if further improvements to the resulting image are still required, a conversion of the calculated mask layout 304 from grey-tone to phase tilt can be accomplished in order to capitalize on the advantage of the increased imaging capability of tilted mirrors with respect to grey-toned pixels FIG. 8 is a graphical illustration 800 of a calibration curve used to convert the grey-tone pixel values, determined above, to corresponding tilt angles. A preliminary use of the calibration curve 800 is to convert the mirror states, which feature the intensity values initially shown in FIG. 3 and then perturbed in FIG. 7, to the proper tilt angle for each of the mirrors within the mirror array 102 to produce a desired image.

A first portion 802 of the calibration curve 800 is used to perform this preliminary utility of converting the gray levels, or intensity values of the pixels, to tilt angles. This conversion is performed by matching the intensity value associated with a given pixel to an intensity value along an axis 804 of the calibration curve 800 which then corresponds to an angle in milliradians (mrad). A second portion 808 of the calibration curve 800, however, provides an additional phase shifting option for those mirrors tilted such that the phase range across the mirror is larger than 360 deg and less than 720 deg. For pixels within this tilt angle range, the resulting phase shift of the mirrors, within the mirror array 102, can improve quality of the resulting image.

Thus, using the technique of the present invention, an aerial image can be developed from the equivalent mirror-based mask layout 304, having characteristics that are used as an initial guess. If this initial guess requires improvements in order to satisfy predetermined image quality requirements, an iterative image improvement process can be activated. This process includes perturbing the state of individual pixels within the equivalent mask layout 304. This adjustment can significantly enhance the quality of lithographic images.

Figure 9:
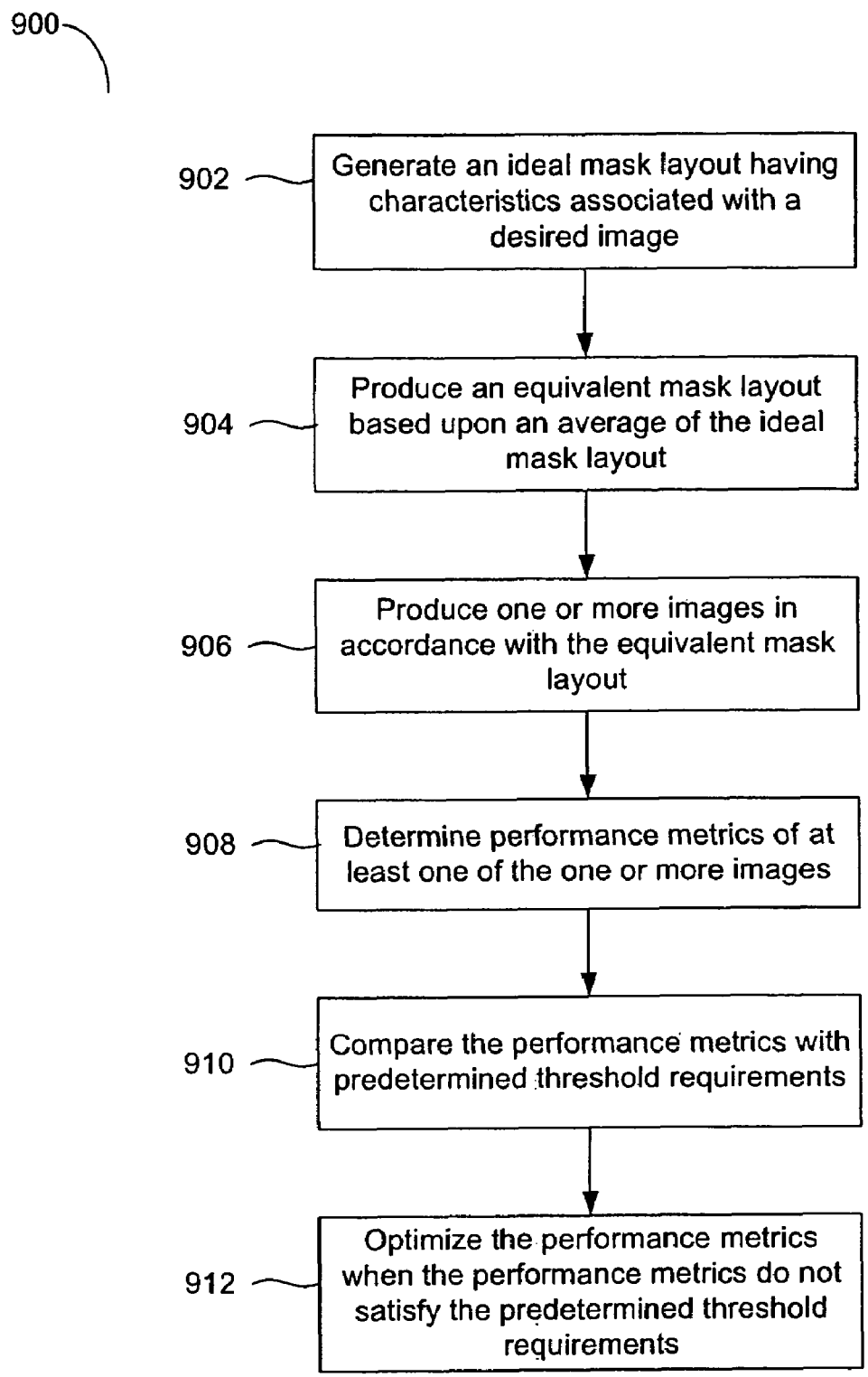
FIG. 9 is a flow diagram of an exemplary method of practicing an embodiment of the present invention.

FIG. 9 is a flow diagram 900 illustrating an exemplary method of practicing the present invention. In the pattern generating technique of the present invention, an ideal binary mask layout is generated having characteristics associated with a desirable image, as illustrated in block 902. In a block 904, an equivalent mask layout is developed based upon an average intensity of the ideal binary mask layout developed in block 902. Next, a simulation tool is used to produce one or more images in accordance with the equivalent mask layout, as indicated in block 906. These images are then tested to determine whether associated performance metrics meet predetermined image quality requirements, as indicated in block 908. In block 910, the resulting performance metrics are compared with predetermined image quality requirements. If the comparison indicates that the performance metrics do not satisfy the predetermined image quality requirements, the equivalent mask layout is optimized as indicated in block 912.

Figure 10:
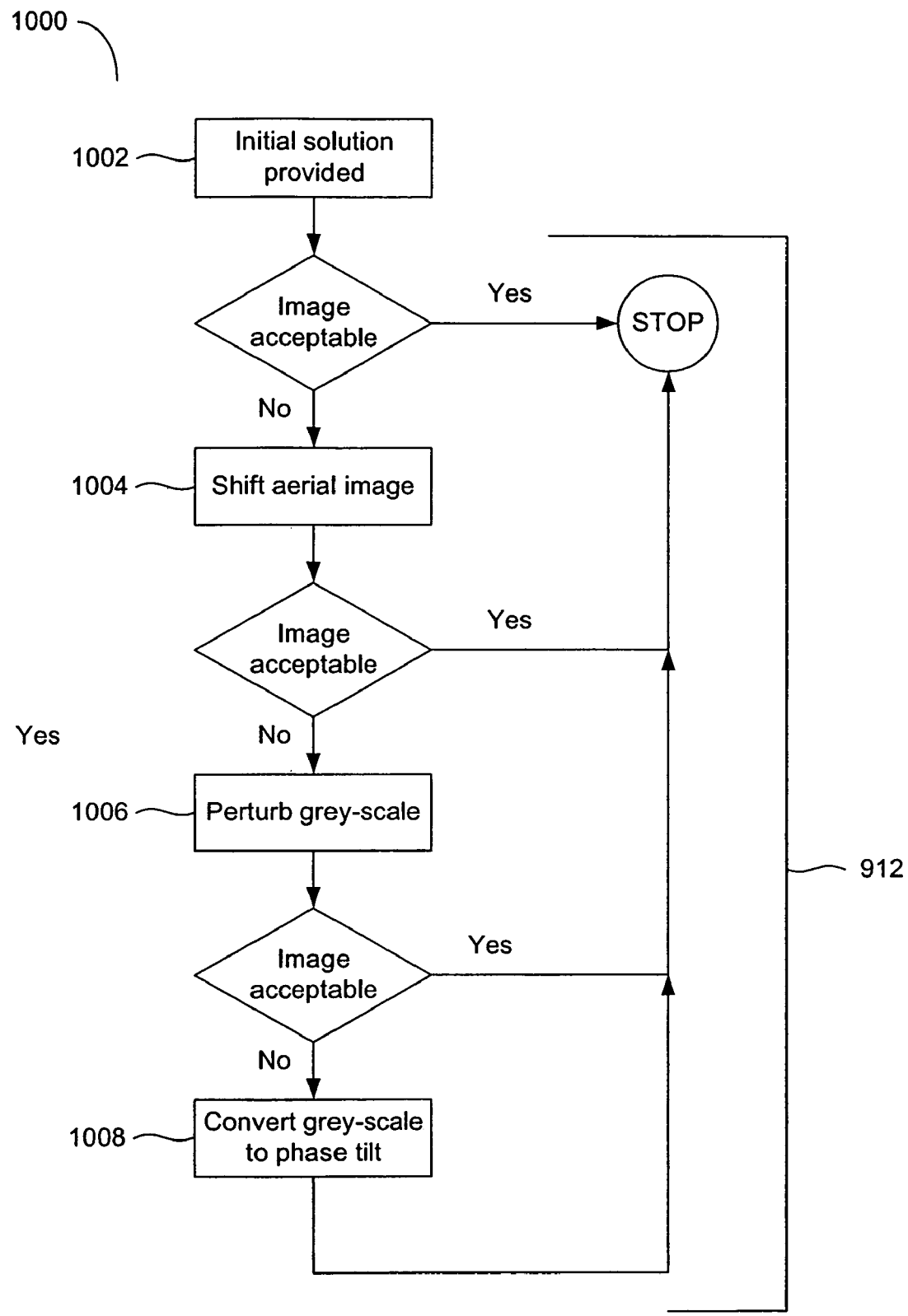
FIG. 10 is a flow diagram providing a more detailed view of an optimization technique illustrated in FIG. 9.

FIG. 10 is a more detailed flow diagram 1000, providing an illustration of additional details of the block 912 of FIG. 9. In block 1002 of FIG. 10, the initial solution is provided as a starting point. If, based upon the equivalent mask layout 304, the image is found to be acceptable, the process stops. If on the other hand however, the image is not found to be acceptable, an optimization feature is activated as shown in block 1004.

The performance metrics are then again compared with the predetermined threshold requirements. If the image is acceptable, the process stops. If the image is not acceptable, the scale value of individual pixels is perturbed as shown in block 1006. If the image is acceptable at this point, the process again stops. If, however, the image is not acceptable, a scale to tilt angle conversion is performed, as indicated in block 1008. If, at this point, the image is still not acceptable, then more radical solutions may be pursued to provide an enhancement to the quality of the image.

Figure 11:
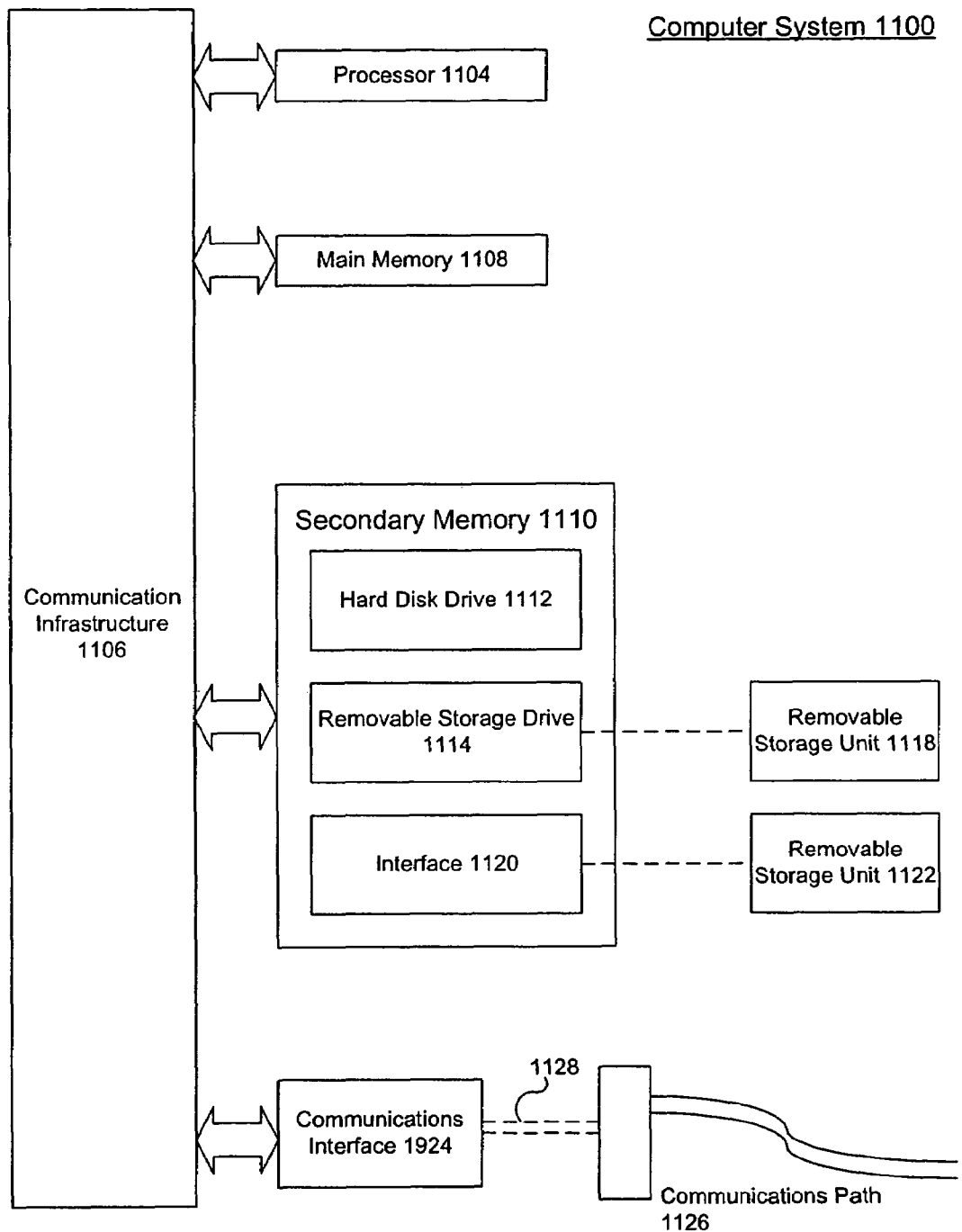
FIG. 11 is a block diagram of an exemplary computer system on which the present invention can be practiced.

FIG. 11 provides an illustration of a general purpose computer system and is provided for completeness. As stated above, the present invention can be implemented in hardware, or as a combination of software and hardware. Consequently, the invention may be implemented in the environment of a computer system or other processing system. An example of such a computer system 1100 is shown in FIG. 11. In the present invention, all of the elements depicted in FIGS. 9 and 10, for example, can execute on one or more distinct computer systems 1100, to implement the various methods of the present invention.

The computer system 1100 includes one or more processors, such as a processor 1104. The processor 1104 can be a special purpose or a general purpose digital signal processor and it's connected to a communication infrastructure 1106 (for example, a bus or network). Various software implementations are described in terms of this exemplary computer system. After reading this description, it will become apparent to a person skilled in the relevant art how to implement the invention using other computer systems and/or computer architectures.

The computer system 1100 also includes a main memory 1108, preferably random access memory (RAM), and may also include a secondary memory 1110. The secondary memory 1110 may include, for example, a hard disk drive 112 and/or a removable storage drive 1114, representing a floppy disk drive, a magnetic tape drive, an optical disk drive, etc. The removable storage drive 1114 reads from and/or writes to a removable storage unit 1118 in a well known manner. The removable storage unit 1118, represents a floppy disk, magnetic tape, optical disk, etc. which is read by and written to by removable storage drive 1114. As will be appreciated, the removable storage unit 1118 includes a computer usable storage medium having stored therein computer software and/or data.

In alternative implementations, the secondary memory 1110 may include other similar means for allowing computer programs or other instructions to be loaded into the computer system 1100. Such means may include, for example, a removable storage unit 1122 and an interface 1120. Examples of such means may include a program cartridge and cartridge interface (such as that found in video game devices), a removable memory chip (such as an EPROM, or PROM) and associated socket, and the other removable storage units 1122 and the interfaces 1120 which allow software and data to be transferred from the removable storage unit 1122 to the computer system 1100.

The computer system 1100 may also include a communications interface 1124. The communications interface 1124 allows software and data to be transferred between the computer system 1100 and external devices. Examples of the communications interface 1124 may include a modem, a network interface (such as an Ethernet card), a communications port, a PCMCIA slot and card, etc. Software and data transferred via the communications interface 1124 are in the form of signals 1128 which may be electronic, electromagnetic, optical or other signals capable of being received by the communications interface 1124. These signals 1128 are provided to the communications interface 1124 via a communications path 1126. The communications path 1126 carries the signals 1128 and may be implemented using wire or cable, fiber optics, a phone line, a cellular phone link, an RF link and other communications channels.

In the present application, the terms "computer readable medium" and "computer usable medium" are used to generally refer to media such as the removable storage drive 1114, a hard disk installed in the hard disk drive 1112, and the signals 1128. These computer program products are means for providing software to the computer system 1100.

Computer programs (also called computer control logic) are stored in the main memory 1108 and/or the secondary memory 1110. Computer programs may also be received via the communications interface 1124. Such computer programs, when executed, enable the computer system 1100 to implement the present invention as discussed herein.

In particular, the computer programs, when executed, enable the processor 1104 to implement the processes of the present invention. Accordingly, such computer programs represent controllers of the computer system 1100. By way of example, in the embodiments of the invention, the processes/methods performed by signal processing blocks of encoders and/or decoders can be performed by computer control logic. Where the invention is implemented using software, the software may be stored in a computer program product and loaded into the computer system 1100 using the removable storage drive 1114, the hard drive 1112 or the communications interface 1124.

In another embodiment, features of the invention are implemented primarily in hardware using, for example, hardware components such as Application Specific Integrated Circuits (ASICs) and gate arrays. Implementation of a hardware state machine so as to perform the functions described herein will also be apparent to persons skilled in the relevant art(s).

CONCLUSION

The present invention provides a systematic technique for generating lithographic images using a maskless lithography system using an array of mirrors in place of a mask. This technique enables mirrors within the array, to be used to print a variety of patterns including nested lines and contact holes at a variety of pitches. Further, optimization techniques can be implemented when the quality of the resulting images is insufficient.

The foregoing description of the preferred embodiments provides an illustration and description, but is not intended to be exhaustive or to limit the invention to the precise form disclosed herein. Modifications or variations are possible consistent with the above teachings or may be acquired from practice of the invention. Thus, it is noted that the scope of the invention is defined by the claims in their equivalence.

What is claimed is:

1. An apparatus comprising:
a memory; and
one or more processors coupled to the memory and configured to,
generate an ideal mask layout representative of image characteristics associated with a desired image, and
generate an equivalent array-of-mirrors layout in accordance with an average intensity of the ideal mask layout.

2. The apparatus of claim 1, wherein the ideal mask layout representative of the image characteristics comprises a binary mask layout representative of the image characteristics.

3. The apparatus of claim 2, wherein the characteristics include at least one of pitch and image position.

4. The apparatus of claim 1, wherein:
each mirror in the array of mirrors has a predetermined mirror width; and
the image characteristics are independent of the predetermined mirror width.

5. The apparatus of claim 1, wherein the ideal mask layout has a mask transmission that can vary continuously.

6. The apparatus of claim 5, wherein the the one or more processors being configured to generate the equivalent array-of-mirrors layout includes the one or more processors being configured to (i) determine a pitch of the desired image and (ii) form a mirror-based masked pattern, the mirror-based masked pattern being a function of the desired image pitch and the mirror width.

7. The apparatus of claim 1, wherein the equivalent array-of-mirrors layout is representative of the desired image in a wafer plane.

8. The apparatus of claim 1, wherein:
the equivalent array-of-mirrors layout corresponds to a number of pattern pixels; and
each of the pixels includes a width and an intensity value, each intensity value being determined by averaging intensity values of a corresponding portion of the ideal mask layout, each pixel intensity value being associated with a corresponding grey-tone level.

9. The apparatus of claim 1, further comprising a simulation tool configured to produce one or more images in accordance with the equivalent array-of-mirrors layout.

10. The apparatus of claim 9, wherein the one or more processors are further configured to determine performance metrics of at least one of the one or more images.

11. The apparatus of claim 10, wherein the performance metrics include at least one from the group including critical dimension, normalized image log slope, and image position.

12. The apparatus of claim 11, wherein the one or more processors are further configured to optimize the performance metrics when the performance metrics do not satisfy predetermined quality requirements.

13. The apparatus of claim 12, wherein the one or more processors being configured to optimize the performance metrics includes at least one from the group including the one or more processors being configured to (a) shift the one or more simulated images in the wafer plane, (b) perturb the grey-tone level of selected ones of the pixels, (c) convert the grey-tone levels to tilt angles when the mirrors are tiltable, and (d) perturb tilt angles.

* * * * *